United States Patent

Hardy et al.

Patent Number: 6,084,537
Date of Patent: Jul. 4, 2000

[54] RETURN-TO-ZERO TRANSMITTER

[75] Inventors: Steven P. Hardy, La Mesa, Calif.; James T. Doyle, Chandler, Ariz.

[73] Assignee: Intel Corporation, Santa Clara, Calif.

[21] Appl. No.: 09/020,102

[22] Filed: Feb. 6, 1998

[51] Int. Cl.[7] .................................................. H03M 5/04
[52] U.S. Cl. .................................................................. 341/68
[58] Field of Search ................................ 341/70, 71, 68, 341/73, 69

[56] References Cited

U.S. PATENT DOCUMENTS 5,942,995  8/1999  Hardy et al. .............................. 341/68

Primary Examiner—Brian Young
Attorney, Agent, or Firm—Trop, Pruner & Hu, P.C.

[57] ABSTRACT

A return-to-zero transmitter includes a one shot circuit, an output circuitry and a timing generator. The one shot circuit is constructed to receive a signal that is indicative of a digital bit and generate an output signal that is indicative of positive and negative edges of the bit. The timing generator receives the output signal of the one shot circuit and causes the output circuitry to generate return-to-zero pulses in response to this signal.

19 Claims, 6 Drawing Sheets

RETURN-TO-ZERO TRANSMITTER

This is a continuation-in-part of U.S. patent application entitled, "RETURN-TO-ZERO RECEIVER," with inventors Steven P. Hardy and James T. Doyle, which was filed on Dec. 30, 1997.

BACKGROUND OF THE INVENTION

The invention relates to a return-to-zero transmitter.

Referring to FIG. 1, quite often it is desirable for digital circuits, such as circuits 10 and 12, to communicate with each other. For example, the circuit 10 might transmit digital bits to the circuit 12 over a communication line 14. The circuits 10 and 12 might be directly connected to the communication line 14. However, to minimize the occurrences of ground loops and DC mismatches between the two circuits 10 and 12, DC blocking elements, such as transformers or capacitors, might be used.

For example, a capacitor 16 may be used to isolate DC bias voltages of the circuits 10 and 12 from each other. However, in doing so, the capacitor 16 filters out the average, or DC component, of the stream of bits that is transmitted across the communication line 14. As a result, if the circuit 10 furnishes bits of data to the line 14, for example, the circuit 12 may encounter difficulties in recovering the bits because the logic one and logic zero threshold voltages of the bits may not be constant due to the filtering. Thus, because the threshold voltages are not constant, distinguishing logic one bits from logic zero bits may present difficulties.

Furthermore, relatively large and expensive high voltage capacitors (e.g., 100 picofarads or more) might be needed to decouple the line 14 from the circuits 10 and 12. Otherwise, without these large capacitors, the data might be undesirably attenuated.

To avoid these difficulties, the circuit 10 may encode the bits via a return-to-zero (RZ) encoding scheme so that the quiescent DC component of the encoded bit stream remains constant. Referring also to FIG. 2, when RZ encoding is used, each logic one bit 27 is encoded into a pair of pulses: a positive going RZ pulse 24 and a negative going RZ pulse 26. The two RZ pulses 24 and 26 are complementary so that each pair of RZ pulses does not disturb the DC level of the encoded bit stream. As a result, constant threshold voltage levels may be used to detect the positive 24 and negative 26 going RZ pulses and thus, decode the bits.

As compared to bits of unencoded data, RZ pulses have a relatively high frequency content. As a result, smaller and less expensive capacitors may be used to decouple the two circuits 10 and 12 from the line 14. Furthermore, due to the high frequency content of the RZ pulses, data may be transferred at a higher rate across the line 14.

Both circuits 10 and 12 might have an RZ transmitter and receiver pair to communicate with the line 14. For example, an RZ transmitter 20 (see FIG. 1) of the circuit 10 encodes a positively sloped edge 27a of the bit 27 into the positive going RZ pulse 24 and encodes a negatively sloped edge 27b of the bit 27 into the negative going RZ pulse 26. An RZ receiver 22 of the circuit 12 receives and decodes the RZ pulses 24 and 26 to reconstruct the bit 27.

Referring to FIG. 3, the RZ transmitter may be formed from, for example, a resistor-capacitor (RC) high pass filter circuit 30. However, a potential difficulty with this arrangement is that the magnitude of the RZ pulses which are generated by the circuit 30 (at its output terminal 32) may depend on the level, or magnitude, of the digital signal (called $V_I$) that is present at an input terminal 31 of the circuit 30. Also, the response time of the circuit 30 may be decreased due to, for example, parasitic impedances (a pad capacitance, for example) present at the output terminal 32.

Thus, there is a continuing need for an RZ transmitter that is less sensitive to input voltage levels and/or parasitic impedances of such a system.

SUMMARY OF THE INVENTION

One embodiment of the invention is generally directed to using a timing generator and a one shot circuit to form a return-to-zero transmitter.

Another embodiment of the invention is generally directed to a return-to-zero transmitter that includes a one shot circuit, an output stage and a timing generator. The one shot circuit receives a signal that is indicative of a digital bit and generates another signal that is indicative of positive and negative edges of the bit. The timing generator receives this other signal and in response, causes the output stage to generate return-to-zero pulses.

In another embodiment, the invention features a method that includes receiving a first signal indicative of a digital bit. In response to the first signal, an edge of the bit is detected. In response to this detection, an amount of charge in a charge storing element is altered. During this alteration, a portion of a return-to-zero pulse is generated. The charge storage element is used to generate another portion of the return-to-zero pulse.

Advantages and other features of the invention will become apparent from the following description, from the drawing and from the claims.

DETAILED DESCRIPTION

Figure 1:
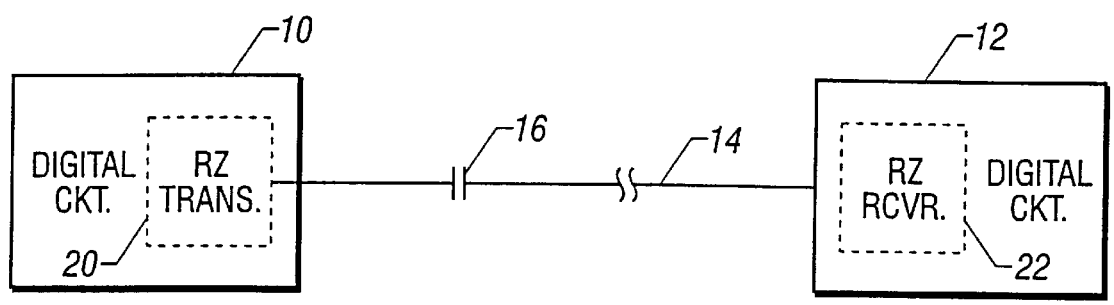
FIG. 1 is a schematic diagram of a conventional communication system for two circuits.
Figure 2:
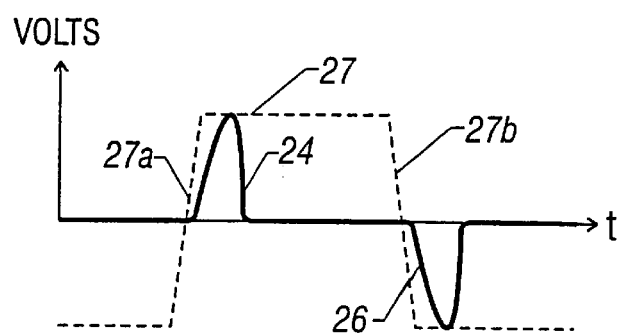
FIG. 2 shows waveforms of signals illustrating return-to-zero encoding.
Figure 3:
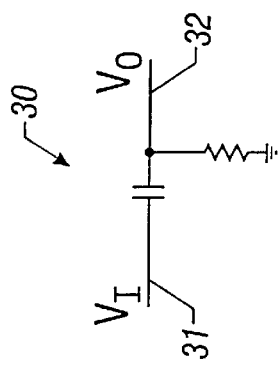
FIG. 3 is a schematic diagram of a conventional return-to-zero transmitter.
Figure 4:
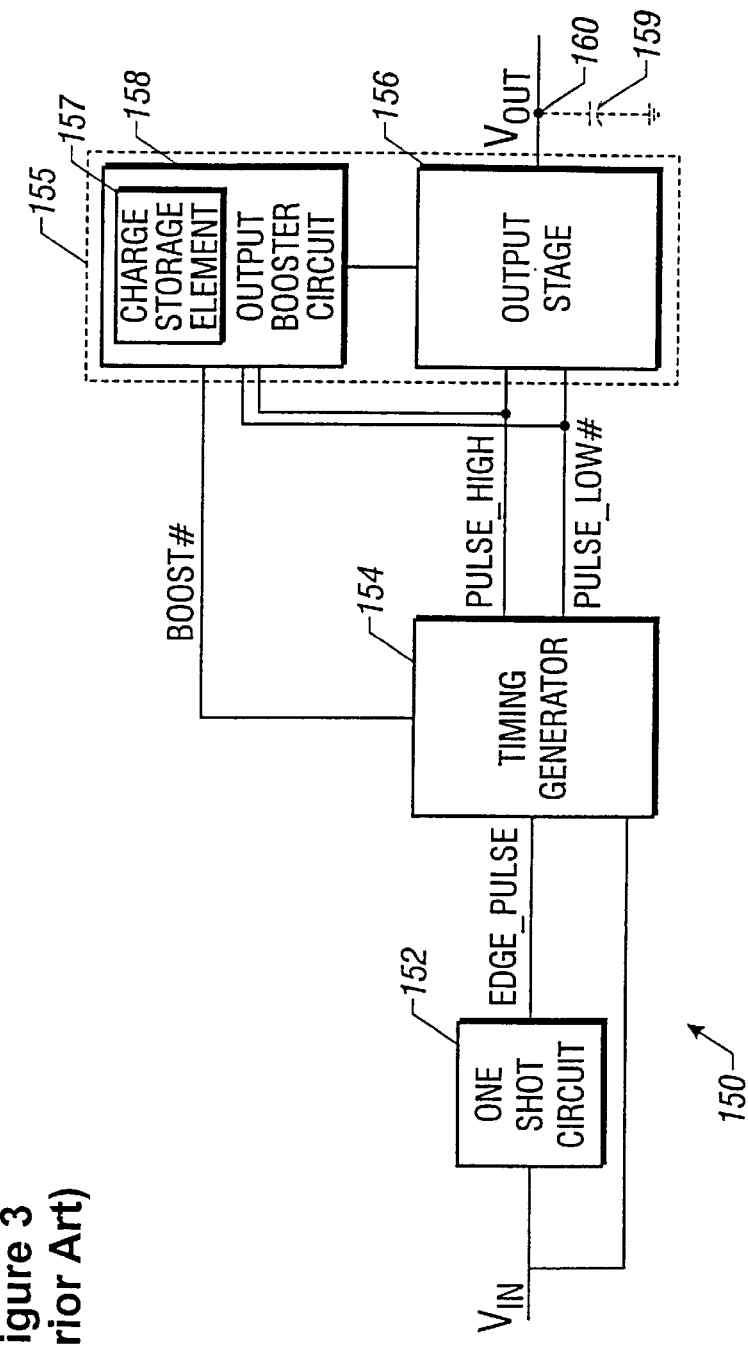
FIG. 4 is a schematic diagram of a return-to-zero transmitter according to an embodiment of the invention.
Figure 5:
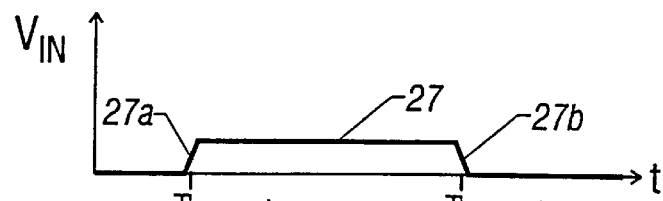
FIGS. 5, 6, 7, 8, 9, 10 and 11 show waveforms of signals of the return-to-zero transmitter of FIG. 4.
Figure 6:
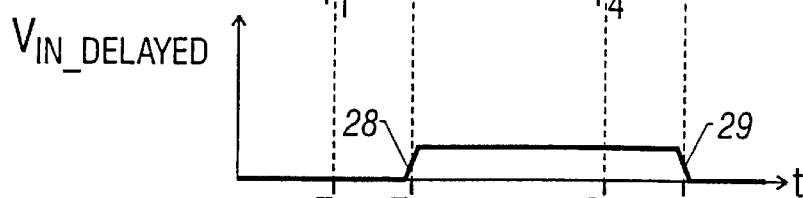
Figure 7:
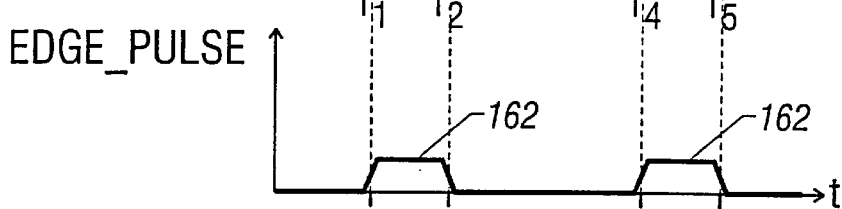
Figure 8:
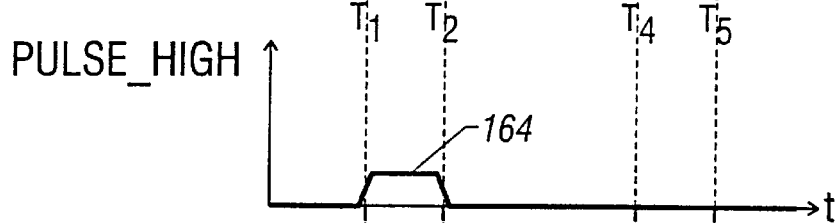
Figure 9:
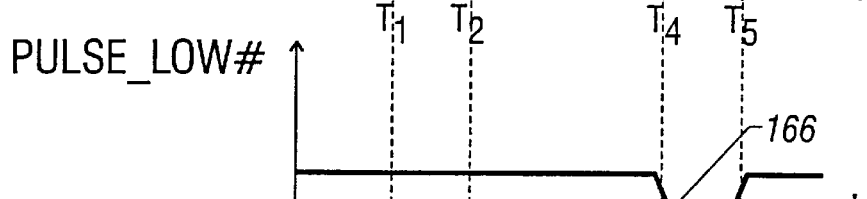
Figure 10:
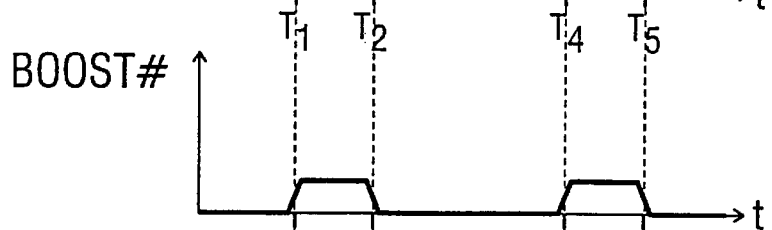

Referring to FIG. 4, an embodiment 150 of a return-to-zero (RZ) transmitter in accordance with the invention is constructed to have a minimum sensitivity to parasitic elements present at an output terminal 160 of the transmitter 150. The transmitter 150 is also constructed to generate RZ pulses that have magnitudes which are independent of the magnitude, or level, of the input signal. The transmitter 150 may include a monostable multivibrator, or one shot circuit 152; a timing generator 154; and output circuitry 155 which may cooperate, as described below, to generate RZ pulses.

Figure 11:
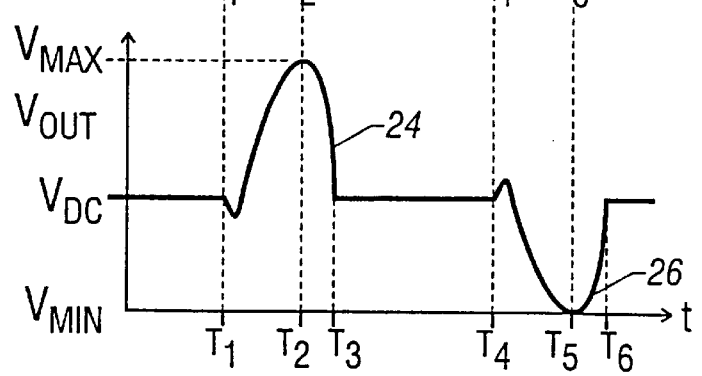

The one shot circuit 152 receives a digital input signal (called $V_{IN}$) which indicates one or more digital bits that are to be RZ encoded. For each bit, the one shot circuit 152 detects the positively and negatively sloped edges of the bit and furnishes signals (described below) to indicate these edge detections. The timing generator 154 may be constructed to respond to these edge detections by interacting with the output circuitry 155 to generate positive 24 and negative 26 going RZ pulses (see illustrative waveform in FIG. 11) at the output terminal 160. Due to the effective isolation provided by the one shot circuit 152 and the timing generator 154, the magnitudes of the RZ pulses that are generated by the transmitter 150 are independent of the magnitude, or level, of the $V_{IN}$ signal.

The generation of approximately the second half of the RZ pulse may present difficulties if not for an output booster circuit 158 of the output circuitry 155. For example, a parasitic impedance, such as a parasitic capacitor 159 (caused by a pad capacitance, for example), may be present at the output terminal 160. This capacitor 159 has a voltage near the quiescent DC voltage of the terminal 160. The generation of the first half of the RZ pulse alters the voltage of and thus, the charge stored in the capacitor 159. To return the voltage level of the terminal back to its quiescent DC level, the charge stored on the capacitor 159 during the generation of the first half of the RZ pulse might need to be restored. This restoration might affect the response of the transmitter.

For example, during the generation of the first half of the positive going RZ pulse 24, the capacitor 159 is precharged until the voltage of the capacitor 159 reaches the maximum voltage of the positive going pulse 24. Due to this precharging, generating the second half of the positive going RZ pulse 24 involves draining the stored charge from the capacitor 159 to return the voltage level of the terminal 160 back to its quiescent DC level.

To counterbalance the effects of parasitic elements present at the output terminal 160, the output circuitry 155 may include an output stage 156 (a transistor stage, for example) that interacts with the output booster circuit 158. The output stage 156 generates approximately the first half of the RZ pulse, and the output booster circuit 158 uses a charge transfer technique to generate approximately the latter half of the RZ pulse, as described below.

Depending on the particular embodiment, the advantages of a transmitter in accordance with the invention may include one or more of the following: The magnitude of the RZ pulses may be independent of the magnitude of the digital input signal. The effects of parasitic impedances may be minimized. The transmitter may be capable of processing data at a high frequency (266 MHz, for example). The shape of the RZ pulses may be independent of the characteristics of the digital input signal. Other advantages and/or combinations of advantages may be possible.

FIGS. 5, 6, 7, 8, 9, 10 and 11 show illustrative waveforms of signals of the transmitter 150. The waveform of FIG. 5 includes a waveform of the $V_{IN}$ signal which may represent, for example, a logic one digital bit 27 to be RZ encoded. When the one shot circuit 152 detects an edge of the bit 27, such as at time T1 or time T4, the one shot circuit 152 pulses high a digital output signal (called EDGE_PULSE (see FIG. 7)) to generate a logic one pulse 162 and thus, to alert the timing generator 154 that an edge has been detected. The EDGE_PULSE signal otherwise has a logic zero level.

In some embodiments, the timing of the one shot circuit 152 is designed to accommodate the rate at which bits are processed by the transmitter 150. In this manner, higher bit rates are usually associated with pulses 162 having shorter durations, and similarly, lower bit rates are usually associated with pulses 162 having longer durations.

In some embodiments, the pulse 162 does not by itself indicate whether a positively sloped edge 27a or a negatively sloped edge 27b has been detected. However, this information might be needed by the timing generator 154 so that the appropriate (negative or positive going) RZ pulse may be generated. To obtain this information, in some embodiments, the timing generator 154 receives the $V_{IN}$ signal in addition to the EDGE_PULSE signal. From the information present in both of these signals, the timing generator 154 determines which edge caused the particular pulse 162 and controls the output stage 156 and output booster circuit 158 accordingly.

In this manner, in some embodiments, if the pulse 162 is caused by the positively sloped edge 27a of the bit 27 (at time T1), the timing generator 154 pulses high a digital signal (called PULSE_HIGH (see FIG. 8)) to generate a logic one pulse 164 (beginning at time T1). The PULSE_HIGH signal otherwise has a logic zero level. In response to the pulse 164, the output stage 156 generates approximately the first half of the positive going RZ pulse 24 from time T1 to time T2, as further described below.

In some embodiments, if the pulse 162 is caused by a negatively sloped edge 27b of the bit 27 (at time T4), the timing generator 154 pulses high a digital signal (called PULSE_LOW# (see FIG. 9)) to generate a logic zero pulse 166 (beginning at time T4). The PULSE_LOW# signal otherwise has a logic one level. In response to the pulse 166, the output stage 156 generates approximately the first half of the negative going RZ pulse 26 from time T4 to time T5, as further described below.

In some embodiments, the output booster circuit 158 selectively couples a charge storage element 157 (one or more integrated circuit capacitor(s), metal-oxide-semiconductor field-effect-transistor (MOSFET) capacitor(s) and/or bond pad(s), as examples) to the output terminal 160 to generate the latter half of the RZ pulse. For the negative going RZ pulse 26, the output booster circuit 158 stores charge in the charge storage element 157 during the generation the first half of the negative going RZ pulse 26. Later, during the generation of the second half of the negative going RZ pulse 26, charge flows from the charge storage element 157 into the parasitic element(s), such as the pad capacitor 159.

This flow of charge increases the voltage level of the terminal 160 and as a result, returns the voltage level to its quiescent DC level (called $V_{DC}$ (see FIG. 11)). Thus, because the charge storage element 157 is precharged during the generation of the first half of the negative going pulse 26, the otherwise undesirable affects caused by, for example, the parasitic capacitor 159 (having almost no charge at the beginning of the generation of the second half of the negative going RZ pulse 26) are counterbalanced.

For the positive going RZ pulse 24, the output booster circuit 158 depletes charge that is stored in the charge storage element 157 when the first half of the positive going RZ pulse 24 is being generated. During the first half of the generation of the positive going RZ pulse 24, parasitic elements, such as the parasitic capacitor 159, are being charged. Later, during the generation of the second half of the positive going pulse 24, charge flows into the charge storage element 157 from these parasitic elements. Thus, the otherwise undesirable charge source introduced by the parasitic elements is counterbalanced, and the charge flow into the element 157 decreases the voltage level of the terminal 160 so that the voltage level of the terminal 160 returns to its quiescent $V_{DC}$ voltage level.

The output booster circuit 158 uses the pulses 164 and 166 of the PULSE_HIGH and PULSE_LOW# signals, respectively, to control the storage (for the generation of the negative going RZ pulses 26) and removal (for the generation of the positive going RZ pulses 24) of charge to/from the charge storage element 157.

The coupling of the charge storage element 157 to the output terminal 160 is controlled by a signal (called BOOST# (see FIG. 10)) which is furnished by the timing generator 154. When the timing generator 154 asserts, or drives low, the BOOST# signal (during time interval T2 to T4 and beginning at time T5), the output booster circuit 158 couples the charge storage element 157 to the output terminal 160. Otherwise, in some embodiments, when the timing generator 154 deasserts, or drives high, the BOOST# signal, the charge storage element 157 is electrically isolated from the output terminal 160.

As an example of the operation of the output booster circuit 158, when the timing generator 154 initiates the pulse 164 at time T1 to initiate the generation of the positive going pulse 24, the output booster circuit 158 responds by removing charge from the charge storage element 157 from time T1 to time T2. At time T2, the positive going pulse 24 reaches its maximum level (called $V_{MAX}$). Thereafter, from time T2 to time T3, the output booster circuit 158 couples the charge storage element 157 to the output terminal 160 in response to the assertion of the BOOST# signal. Because the charge storage element 157 is depleted of charge, charge from the parasitic capacitor 159 enters the charge storing element 157 to return the voltage of the output terminal 160 to its quiescent DC value $V_{DC}$.

Similarly, when the timing generator 154 generates the pulse 166 beginning at time T4 to initiate the generation of negative going pulse 26, the output booster circuit 158 responds by storing charge in the charge storage element 157 from time T4 to time T5. At time T5, the negative going pulse 26 reaches its minimum magnitude (called $V_{MIN}$). Thereafter, from time T5 to time T6, the output booster circuit 158 couples the charge storage element 157 to the output terminal 160 in response to the assertion of the BOOST# signal. Because the charge storage element 157 has stored charge, charge from the charge storage element 157 flows to the output terminal 160 and the voltage of the output terminal 160 returns to its quiescent DC value $V_{DC}$.

Figure 12:
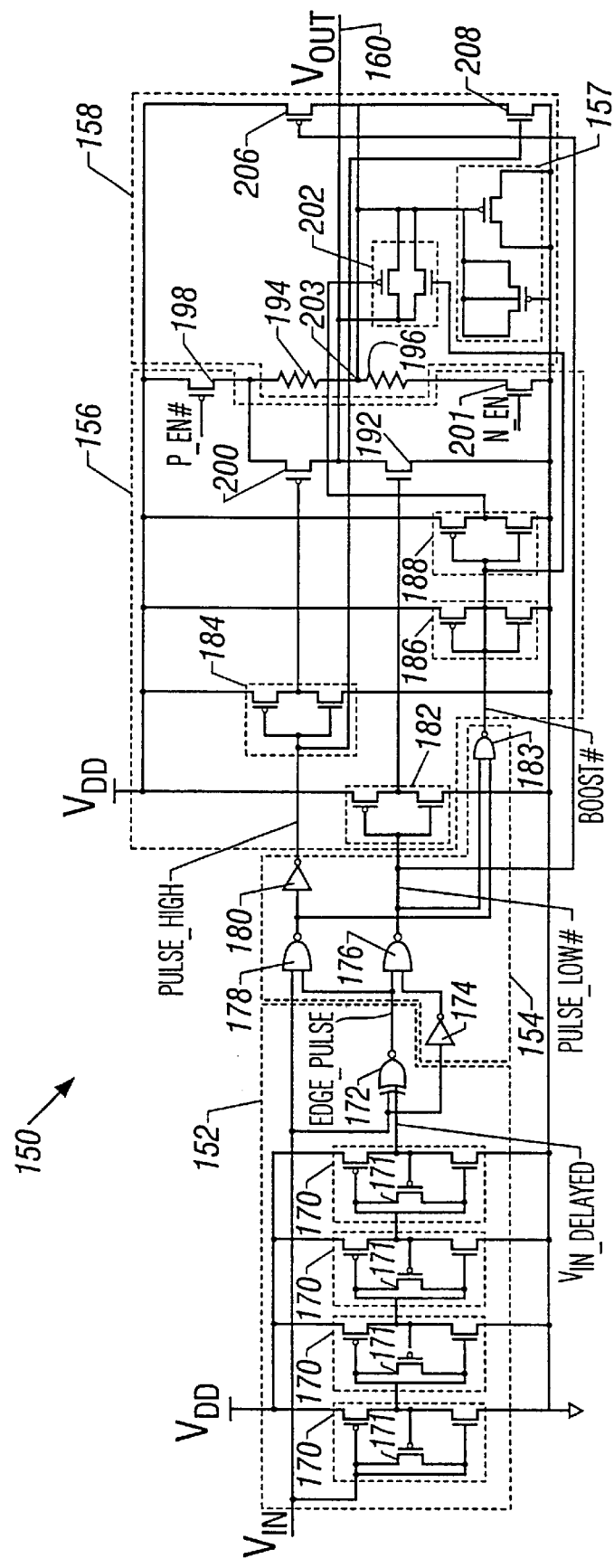
FIG. 12 is a more detailed schematic diagram of the transmitter of FIG. 4.

Referring to FIG. 12, in some embodiments, the one shot circuit 152 includes an exclusive OR (XOR) gate 172 that furnishes the EDGE_PULSE signal at an output terminal. The XOR gate 172 performs an exclusive OR comparison of the $V_{IN}$ signal with a signal (called $V_{IN\_DELAYED}$ (see FIG. 6 )) that represents the $V_{IN}$ signal delayed by a propagation delay. In this manner, when the two signals (see FIGS. 5 and 6) do not concurrently have the same logical state, the XOR gate 172 generates the pulse 162 (see FIG. 7).

The duration of the pulse 162 depends on how long the two signals $V_{IN}$ and $V_{IN\_DELAYED}$ have different states. For example, when the $V_{IN}$ signal represents the logic one bit 27, the pulse 164 begins (at time T1) at the positively sloped edge 27a of the bit 27 and ends (at time T2) at a positively sloped edge 28 of the $V_{IN\_DELAYED}$ signal. During times T1 to T2, the $V_{IN}$ and $V_{IN\_DELAYED}$ signals have the same logical state. Continuing this example, the pulse 166 begins (at time T4) at the negatively sloped edge 27b of the bit 27 and ends (at time T5) at a negatively sloped edge 29 of the $V_{IN\_DELAYED}$ signal. During times T2 to T4, the $V_{IN}$ and $V_{IN\_DELAYED}$ signals have the same logical state.

The $V_{IN\_DELAYED}$ signal is generated by, for example, four complementary metal-oxide-semiconductor (CMOS) inverters 170 that are serially coupled between the $V_{IN}$ signal and the second input terminal of the XOR gate 172. More or fewer inverters may be used to generate the $V_{IN\_DELAYED}$ signal. In some embodiments, an even number of inverters may be used.

Also, in some embodiments, Miller compensation might be used in one or more of the inverters 170. For these inverters, a PMOS transistor 171, for example, might be coupled between the input and output of the inverter.

In some embodiments, the timing generator 154 includes a NAND gate 176 that generates the PULSE_LOW# signal at an output terminal of the gate 176. An input terminal of the NAND gate 176 receives an inverted version of the $V_{IN}$ signal (provided by an output terminal of an inverter 174), and another input terminal of the NAND gate 176 receives the EDGE_PULSE signal.

To generate the PULSE_HIGH signal, an input terminal of a NAND gate 178 receives the $V_{IN}$ signal, and another input terminal of the NAND gate 178 receives the EDGE_PULSE signal. An inverter 180, which has an input terminal coupled to an output terminal of the NAND gate 178, furnishes the PULSE_HIGH signal at an output terminal of the inverter 180.

A NAND gate 183 furnishes the BOOST# signal at an output terminal of the gate 183. One input terminal of the NAND gate 183 receives a PULSE_HIGH# signal (an inverted representation of the PULSE_HIGH signal), and another input terminal of the NAND gate 183 receives the PULSE_LOW# signal.

In some embodiments, the output stage 156 includes an n-channel metal-oxide-semiconductor (NMOS) transistor 192 that is activated (by the assertion, or driving low, of the PULSE_LOW# signal) to form approximately the first half of the negative going RZ pulse 26. In this manner, the PULSE_LOW# signal is inverted by an inverter 182 which has its output terminal coupled to the gate of the transistor 192. The drain of the transistor 192 is coupled to the output terminal 160 of the transmitter 150, and the source of the transistor 192 is coupled to ground.

As a result of this arrangement, when the PULSE_LOW# signal is asserted, or driven low, the transistor 192 pulls the voltage level of the terminal 160 toward ground. When the PULSE_LOW# signal is deasserted, or driven high, the drain-source path of the transistor 192 does not conduct, and the output booster circuit 158 pulls the voltage level of the terminal 160 toward its long term DC level to form the second half of the negative going RZ pulse 26.

The output stage 156 may also include a p-channel metal-oxide-semiconductor (PMOS) transistor 200 that is activated (by the assertion, or driving high, of the PULSE_HIGH signal) to form the first half of the positive going RZ pulse 24. In this manner, the PULSE_HIGH signal is inverted by an inverter 184 which has its output terminal coupled to the gate of the transistor 200. The drain of the transistor 200 is coupled to the output terminal 160 of the transmitter 150, and the source of the transistor 200 is coupled to a positive supply voltage level (called $V_{DD}$).

As a result of this arrangement, when the PULSE_HIGH signal is asserted, or driven high, the transistor 200 pulls the voltage level of the terminal 160 toward the $V_{DD}$ voltage level. When the PULSE_HIGH signal is deasserted, or driven low, the source-drain path of the transistor 200 does not conduct, and the output booster circuit 158 pulls the voltage level of the terminal 160 toward its long term DC level to form the second half of the positive going RZ pulse 24.

To selectively enable/disable the RZ transmitter 150, NMOS 201 and PMOS 198 transistors may be used. The NMOS transistor 201 has its drain-source path coupled between the source of the transistor 201 and ground, and the PMOS transistor 198 has its source-drain path coupled between the source of the transistor 198 and the $V_{DD}$ supply voltage level. The gates of the transistors 198 and 201 receive digital input signals (called P_EN# and N_EN, respectively) which are asserted (i.e., the P_EN# signal is driven low and the N_EN signal is driven high) to cause the transistors 198 and 201 to conduct and enable the transmitter 150. The input signals are deasserted to disable the transistors 198 and 201 and thus, the transmitter 150.

In some embodiments, the output booster circuit 158 includes the charge storage element 157, which may include in some embodiments, capacitors formed from NMOS transistors. The charge storage element 157 is selectively coupled to the output terminal 160 by a CMOS transmission gate 202. The transmission gate 202 is formed from a PMOS and an NMOS transistor that are coupled in parallel. The capacitors may be coupled in parallel and thus, have two common terminals. For this arrangement, the transmission gate 202 is coupled to one common terminal 203 of the capacitors, and the other common terminal of the capacitors is coupled to ground.

The gate of the PMOS transistor of the transmission gate 202 is coupled to the output terminal of an inverter 188. An input terminal of another inverter 186 receives the BOOST# signal. The gate of the NMOS transistor of the transmission gate 202 is coupled to the output terminal of an inverter 186. An input terminal of the inverter 188 is connected to the output terminal of the inverter 186. In this manner, when the timing generator 154 asserts, or drives low, the BOOST# signal, both transistors of the transmission gate 202 conduct which couples the charge storage element 157 to the terminal 160.

During the generation of the first half of the positive going pulse 24, charge is drained from the charge storage element 157. To accomplish this, the drain-source path of an NMOS transistor 208 is coupled between the terminal 203 and ground. The gate of the transistor 208 receives the PULSE_HIGH signal. In this manner, when the PULSE_HIGH signal is asserted, or driven high, the transistor 208 conducts and charge stored in the capacitors of the charge storage element 157 is depleted.

During the generation of the first half of the negative going pulse 26, charge is furnished to the charge storage element 157. To accomplish this, the source-drain path of a PMOS transistor 206 is coupled between the supply voltage level $V_{DD}$ and the terminal 203. The gate of the transistor 206 receives the PULSE_LOW# signal. In this manner, when the PULSE_LOW# signal is asserted, or driven low, the transistor 206 conducts and charge is stored in the charge storage element 157.

In some embodiments, the quiescent DC voltage level ($V_{DC}$) of the terminal 160 is established by a resistor voltage divider formed from resistors 194 and 196 which are serially coupled between the drains of the transistors 198 and 200. The terminal 203 is formed from the union of the two resistors 194 and 196. Due to this arrangement, when charge flow between the charge storage element 157 and the terminal 160 ceases near the end of the RZ pulse, the DC voltage level of the terminal 160 approaches a level approximately midway between the supply voltage level and ground. The DC level of the terminal 160 may be adjusted, for example, by adjusting the resistances of the resistors 194 and 196 relative to each other.

Figure 13:
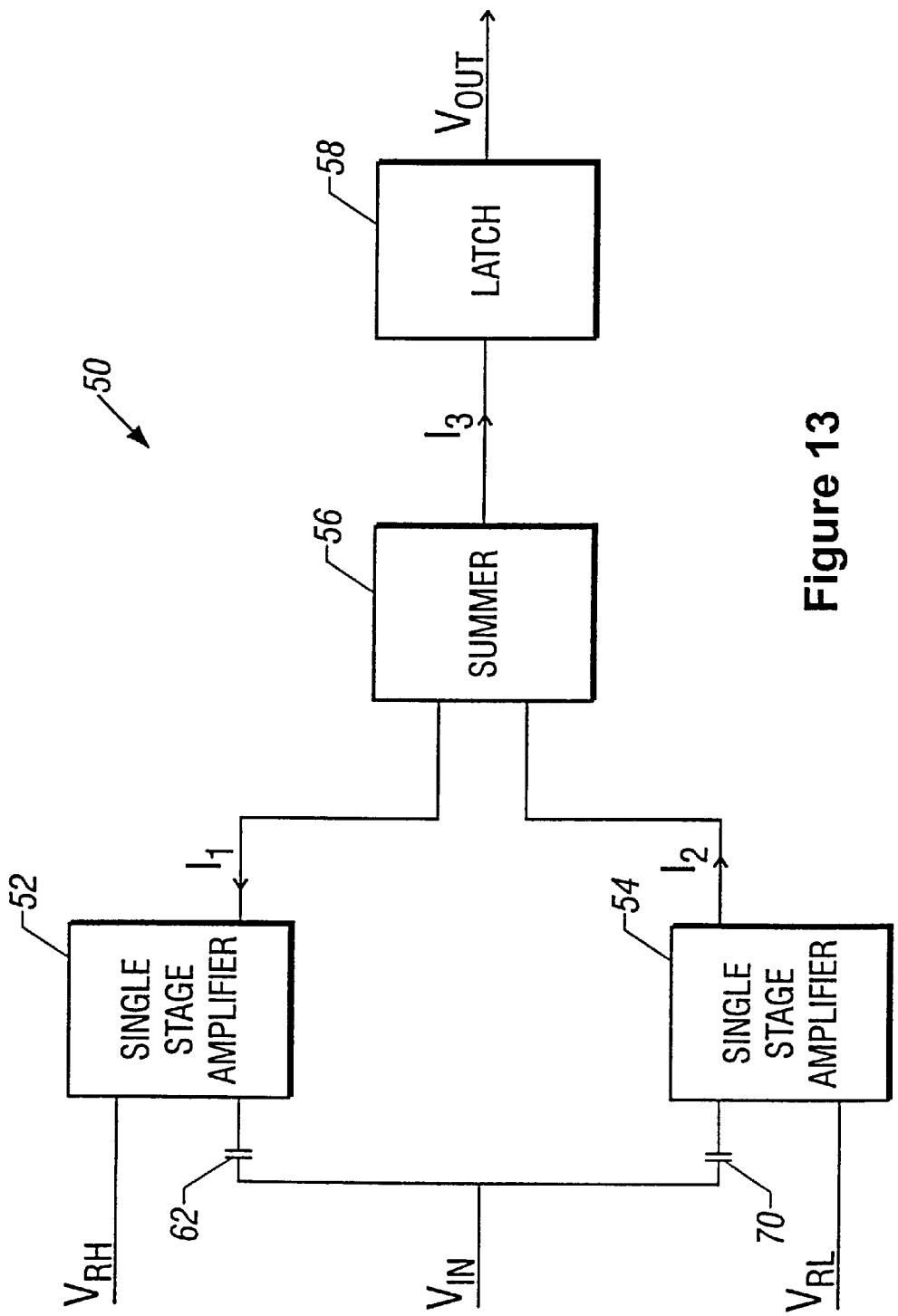
FIG. 13 is a schematic diagram of a return-to-zero receiver.

The transmitter 150 may be used in conjunction with an RZ receiver that decodes the bits, such as an embodiment 50 shown in FIG. 13. The receiver 50 is formed from single stage amplifiers, such as single stage amplifiers 52 and 54. In this context, the term "single stage" refers to the use of one of the many types of stages that are used in conventional amplifier design. For example, the term "single stage" includes configurations where a transistor is coupled in a common base, common emitter, common gate or common source configuration. The term "single stage" also includes, for example, a differential amplifier stage which includes two transistors that are coupled in a differential arrangement.

The advantages of using single stage amplifiers to form a return-to-zero receiver may include one or more of the following. Less die area may be consumed. Overall power consumption may be decreased, standby power dissipation may be decreased, and response time may be decreased.

Both amplifiers 52 and 54 are coupled (via capacitors 62 and 70) to receive an input signal (called $V_{IN}$) and are constructed to respond in a complementary manner to positive and negative going RZ pulses that are present in the $V_{IN}$ signal. In this manner, the amplifier 52 responds to a positive going RZ pulse 24 (see FIG. 11), and the amplifier 54 responds to a negative going RZ pulse 26.

A summer 56 algebraically sums two current signals (called $I_1$ and $I_2$) to form a current signal (called $I_3$) that is used to control the state of a latch 58. The latch 58, in turn, is constructed to generate a digital voltage output signal (called $V_{OUT}$) that is representative of the decoded bits 27 (see FIG. 5) and is provided to one of the bit lines 30 of the bus 33. The single stage amplifier 52 furnishes the $I_1$ signal which removes current from the summer 56, and the single stage amplifier 54 furnishes the $I_2$ signal which supplies current to the summer 56. As a result of this complementary arrangement, when the magnitudes of the signals $I_1$ and $I_2$ are substantially equal to each other, the $I_3$ signal has a magnitude near zero.

The $I_3$ signal has a positive orientation in a direction from the summer 56 to the latch 58. When the magnitude of the $I_3$ signal is substantially greater than zero, the latch 58 drives the $V_{OUT}$ signal low. When the magnitude of the $I_3$ signal is substantially less than zero, the latch 58 drives the $V_{OUT}$ signal high. Otherwise, when the magnitude of the $I_3$ signal is near zero (i.e., when the magnitudes of the two signals $I_1$ and $I_2$ are substantially equal), the latch 58 maintains the state of the $V_{OUT}$ signal. The latch 58 also aids in shaping the $V_{OUT}$ signal, as described below.

The amplifier 52 recognizes the positive going pulse 24 by determining when the magnitude of the $V_{IN}$ signal exceeds a bias voltage level (called $V_{RH}$). The amplifier 52 recognizes the negative going pulse 26 by determining when the magnitude of the $V_{IN}$ signal falls below another bias voltage level (called $V_{RL}$). In other embodiments, techniques other than level detection may be used to recognize the positive 24 and negative 26 going pulses.

Therefore, the single stage amplifiers 52 and 54 selectively adjust the magnitudes of the current signals $I_1$ and $I_2$ in response to the positive 24 and negative 26 going RZ pulses. These adjustments, in turn, drive the $V_{OUT}$ signal which represents the decoded bits 27.

Figure 14:
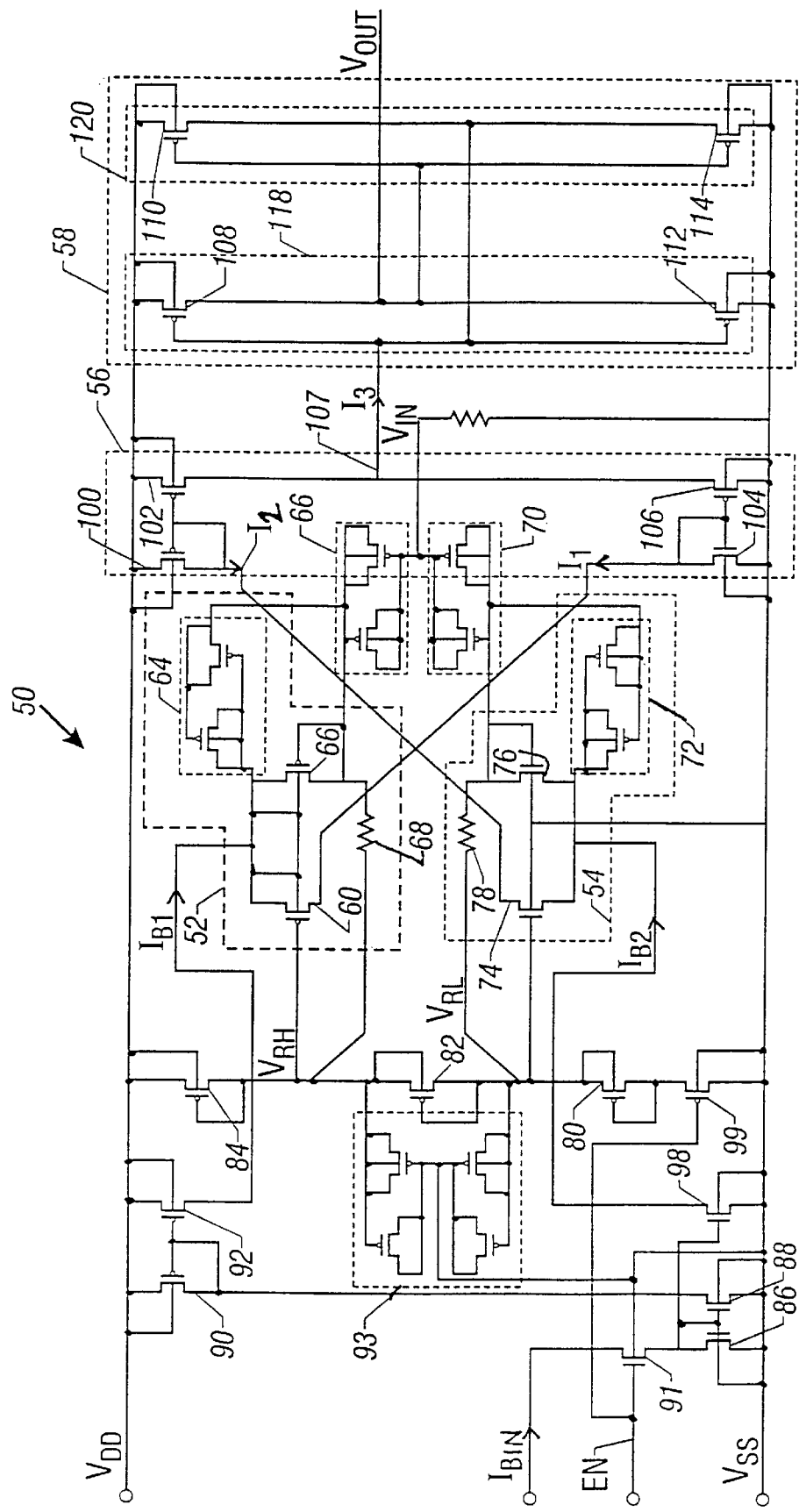
FIG. 14 is a more detailed schematic diagram of the receiver of FIG. 13.

Many embodiments are possible for the single stage amplifiers. As an example, referring to FIG. 14, the amplifier 52 includes a p-channel metal-oxide-semiconductor (PMOS) transistor 60 that is coupled in a common gate configuration. In this manner, the source of the transistor 60 receives a representation of the $V_{IN}$ signal and uses this representation to detect the positive going RZ pulse 24 and generate the $I_1$ signal.

The bias currents and voltages of the transistor 60 are established via a bias current (called $I_{B1}$), the bias voltage level $V_{RH}$, a PMOS transistor 66 and a resistor 68. The $I_{B1}$ current flows through the source-drain path of the transistor 60 and through a path which includes the source-drain path of the transistor 66 and the resistor 68. The source of the transistor 66 is coupled to the source of the transistor 60, and the gate of the transistor 66 is coupled to the drain of the transistor 66 which places the transistor 66 in a "diode configuration." The drain of the transistor 66 is serially coupled to the $V_{RH}$ voltage level through the resistor 68.

The transistor 66 and the resistor 68 are bias elements which establish the bias current flowing through the transistor 60 and the voltage level of the source of the transistor 60. In some embodiments, about 80% of the $I_{B1}$ current flows through the source-drain path of the transistor 60, and the remaining 20% of the $I_{B1}$ current flows through the source-drain path of the transistor 66. As a result, reserve current is present in the transistor 66 when the positive going RZ pulse 24 arrives. In some embodiments, the transistors 60 and 66 are designed to form a "matched pair."

The $V_{IN}$ signal is coupled to the source of the transistor 60 through the capacitor 62 (formed from two PMOS transistors, for example) and a capacitor 64 (formed from two PMOS transistors, for example). The capacitor 62 decouples any DC component of the $V_{IN}$ signal from the rest of the receiver 50. The capacitor 64 functions as a battery to hold the gate-source voltage of the transistor 66 substantially constant when the receiver 50 receives the positive going RZ pulse 24.

The capacitor 62 has one terminal that receives the $V_{IN}$ signal and one terminal that is coupled to the gate (and drain) of the transistor 66. The capacitor 64 is coupled in parallel with the gate and source of the transistor 66.

The amplifier 54 includes an n-channel metal-oxide-semiconductor (NMOS) transistor 74 that is coupled in a common gate configuration. In this manner, the source of the transistor 74 receives a representation of the $V_{IN}$ signal. The transistor 74 uses this representation to detect the negative going RZ pulse 26 and generate the $I_2$ signal.

The bias currents and voltages of the transistor 74 are established via a bias current (called $I_{B2}$), the bias voltage level $V_{RL}$, an NMOS transistor 76 and a resistor 78. The $V_{RL}$ voltage level is received by the gate of the transistor 76 and effectively sets the threshold voltage $V_{TL}$ level which is slightly lower than the voltage level $V_{RL}$. A capacitor 93 (formed from PMOS transistors, for example) is coupled between the $V_{RH}$ and $V_{RL}$ voltage levels.

The $I_{B2}$ current flows through the drain-source path of the transistor 74 and through a path which includes the drain-source path of the transistor 76 and the resistor 78. The source of the transistor 76 is coupled to the source of the transistor 74. The gate of the transistor 76 is coupled to the drain of the transistor 76 which places the transistor 76 in a "diode configuration." The drain (and gate) of the transistor 76 is serially coupled to the $V_{RL}$ voltage level through the resistor 78.

The transistor 76 and the resistor 78 are bias elements which establish the bias current flowing through the transistor 74 and the voltage level of the source of the transistor 74. In some embodiments, about 80% of the $I_{B2}$ current flows through the drain-source path of the transistor 74, and the remaining 20% of the $I_{B2}$ current flows through the drain-source path of the transistor 76. As a result, reserve current is present in the transistor 76 when the receiver 50 receives the negative going RZ pulse 26. In some embodiments, the transistors 74 and 76 are designed to form a "matched pair."

The $V_{IN}$ signal is coupled to the source of the transistor 74 through the capacitor 70 (formed from two PMOS transistors, for example) and a capacitor 72 (formed from two PMOS transistors, for example). The capacitor 70 decouples any DC component of the $V_{IN}$ signal from the rest of the receiver 50. The capacitor 72 functions as a battery to hold the gate-source voltage of the transistor 76 nearly constant when the receiver 50 receives the negative going RZ pulse 26.

The capacitor 70 has one terminal that receives the $V_{IN}$ signal and one terminal that is coupled to the gate (and drain) of the transistor 76. The capacitor 72 is coupled in parallel with the gate and source of the transistor 76.

The summer 56 includes a current mirror formed from an NMOS transistor 104 and an NMOS transistor 106. To accomplish this, the gate and drain of the transistor 104 and the gate of the transistor 106 are all coupled together. As a result, the current flowing through the drain-source path of the transistor 104 is mirrored in the drain-source path of the transistor 106.

In some embodiments, the aspect ratio of the transistor 106 is larger than the aspect ratio of the transistor 104 so that current amplification is achieved. For example, in some embodiments, the aspect ratio of the transistor 106 is two times larger than the aspect ratio of the transistor 104.

The drain of the transistor 104 is coupled to the drain of the transistor 60 and thus, receives the $I_1$ signal. The sources of the transistors 104 and 106 are coupled to the $V_{SS}$ voltage level, and the drain of the transistor 106 is coupled to a node 107.

In this manner, when the amplifier 52 receives a positive going pulse 24, the amplifier 52 substantially increases the magnitude of the $I_1$ signal over its bias value which pulls the voltage of the node 107 near the $V_{SS}$ supply voltage level. Also, during reception of the positive going pulse 24, the magnitude of the $I_3$ signal falls substantially below zero which causes the latch 58 to drive the $V_{OUT}$ signal high, as described below. When the positive going pulse 24 is not being received, the amplifier 52 allows the magnitude of the $I_1$ signal to approach its bias value. For this case, the voltage level of the node 107 is dependent on other factors, described below.

The summer 56 also includes a current mirror formed from a PMOS transistor 100 and a PMOS transistor 102. To accomplish this, the gate and drain of the transistor 100 and the gate of the transistor 102 are all coupled together. As a result, the current flowing through the source-drain path of the transistor 100 is mirrored in the source-drain path of the transistor 102.

In some embodiments, the aspect ratio of the transistor 102 is larger than the aspect ratio of the transistor 100 so that current amplification is achieved. For example, in some embodiments, the aspect ratio of the transistor 102 is two times larger than the aspect ratio of the transistor 100.

The drain of the transistor 100 is coupled to the drain of the transistor 74 and thus, receives the $I_2$ signal. The sources of the transistors 100 and 102 are coupled to the $V_{DD}$ voltage level, and the drain of the transistor 102 is coupled to the node 107.

In this manner, when the amplifier 54 receives a negative going pulse 26, the amplifier 54 substantially increases the magnitude of the $I_2$ signal over its bias value which pulls the voltage of the node 107 near the $V_{DD}$ supply voltage level. When the amplifier 54 allows the magnitude of the $I_2$ signal to drop back to its bias level, the voltage of the node 107 is dependent on the magnitude of the $I_1$ signal. Thus, if the magnitude of the $I_1$ signal is substantially above its bias level, and the magnitude of the $I_2$ signal is near its bias level, the transistor 106 is fully turned on, and the transistor 102 is barely conducting. As a result, the voltage of the node 107 is pulled near the $V_{SS}$ supply voltage level.

If the magnitudes of both of the signals $I_1$ and $I_2$ are near their bias levels, a condition that indicates no pulses are present, the transistors 102 and 106 are both barely conducting which causes the voltage of the node 107 to be approximately midway between the voltage levels $V_{DD}$ and $V_{SS}$.

The latch 58 includes two CMOS inverters 118 and 120 that are coupled back-to-back to form a latch. In this manner, one CMOS inverter 118 is formed from a PMOS transistor 108 and an NMOS transistor 112. The input of the inverter 118 is coupled to the node 107, and output of the inverter 118 furnishes the $V_{OUT}$ signal.

The other CMOS inverter 120 is formed from a PMOS transistor 110 and an NMOS transistor 114. The output of the inverter 120 is coupled to the input of the inverter 118. The input of the inverter 120 receives the $V_{OUT}$ signal.

When the magnitude of the $I_3$ signal is substantially different from its bias level, the latch 58 sets the state of the $V_{OUT}$ signal accordingly. However, when the magnitude of the $I_3$ signal is neither high nor low (i.e., when the voltage level of the node 107 is approximately midway between the voltage levels $V_{DD}$ and $V_{SS}$) the latch 58 retains the previous state of the $V_{OUT}$ signal.

Among the other features of the receiver 50, the voltage levels $V_{RH}$ and $V_{RL}$ are furnished by a voltage divider that is formed from a string of PMOS transistors 80, 82 and 84 that are serially coupled between the voltage levels $V_{DD}$ and $V_{SS}$. The transistors 80, 82 and 84 are each coupled in a diode configuration, i.e., each transistor has its gate coupled to its drain. In this manner, the transistor 84 is coupled to the $V_{DD}$ supply voltage level; the transistor 82 is serially coupled to the transistor 84; and the transistor 80 is serially coupled to the transistor 82 and to the $V_{SS}$ supply voltage level.

The $V_{RH}$ voltage level is furnished by the drain of the transistor 84, and the $V_{RL}$ voltage level is furnished by the drain of the transistor 82. The $V_{RH}$ voltage level has is a predetermined amount above the midway point between the supply voltage levels $V_{DD}$ and $V_{SS}$. The $V_{RL}$ voltage level is the same predetermined amount below the midway point between the supply voltage levels $V_{DD}$ and $V_{SS}$.

The $I_{B1}$ current is furnished by a current mirror that is formed from two PMOS transistors 90 and 92. The gate of the transistor 90 is coupled to its drain and to the gate of the transistor 92, and the sources of the transistor 90 and 92 are coupled to the $V_{DD}$ supply voltage level. The drain of the transistor 92 furnishes the $I_{B1}$ current. The drain of the transistor 90 receives current from another current mirror that is formed from three NMOS transistors 86, 88 and 98.

The gate of the transistor 86 is coupled to its drain and to the gate of the transistor 88, and the sources of the transistors 86 and 88 are coupled to the $V_{SS}$ voltage level. The drain of the transistor 86 receives a bias current (called $I_{BIN}$).

The drain of the transistor 98 furnishes the $I_{B2}$ current. The gate of the transistor 98 is coupled to the gates of the transistors 86 and 88, and the source of the transistor 98 is coupled to the $V_{SS}$ supply voltage level.

An NMOS transistor 91 has its drain-source path coupled in series with the drain-source path of the transistor 82. The gate of the transistor 91 receives a signal (called EN) that is asserted to cause the transistor 91 to conduct and thus, enable the receiver 50. The EN signal is also received by the gate of an NMOS transistor 99 that has its drain-source path serially coupled between the source-drain path of the transistor 80 and the $V_{SS}$ voltage level. In this manner, when the EN signal is driven high, the transistor 99 conducts and the receiver 50 is enabled. Otherwise, the transistor 99 does not conduct, and as a result, the receiver 50 is disabled.

While the invention has been disclosed with respect to a limited number of embodiments, those skilled in the art will appreciate numerous modifications and variations therefrom. It is intended that the appended claims cover all such modifications and variations as fall within the true spirit and scope of the invention.

What is claimed is:

1. A return-to-zero transmitter comprising:
    a one shot circuit to receive a first signal indicative of at least one digital bit and generate a second signal indicative of positive and negative edges of the bit;
    output circuitry; and
    a timing generator to receive the second signal and, in response to the second signal, cause the output circuitry to generate return-to-zero pulses.

2. The return-to-zero transmitter of claim 1, wherein the output circuitry comprises:
    an output terminal to furnish the return-to-zero pulses; and
    an output booster circuit comprising:
        a charge storage element; and
        coupling circuitry to selectively couple the charge storage element to the output terminal to form a first portion of at least one of the return-to-zero pulses.

3. The return-to-zero transmitter of claim 2, the output circuitry further comprising:
    a transistor activated to couple the output terminal to a reference voltage level to form a second portion of said at least one of the return-to-zero pulses.

4. The return-to-zero transmitter of claim 3, wherein the reference voltage level comprises a voltage level substantially near ground.

5. The return-to-zero transmitter of claim 3, wherein the reference voltage comprises a positive voltage supply level.

6. The return-to-zero transmitter of claim 3, wherein the transistor is coupled to be deactivated during the first portion of said at least one of the return-to-zero pulses.

7. The return-to-zero transmitter of claim 3, further comprising:
    another transistor activated to store charge in the storage element before the formation of the first portion of said at least one of the return-to-zero pulses.

8. The return-to-zero transmitter of claim 3, further comprising:
    another transistor activated to remove charge from the charge storage element before the formation of the first portion of said at least one of the return-to-zero pulses.

9. The return-to-zero transmitter of claim 3, wherein the second portion occurs before the first portion.

10. The return-to-zero transmitter of claim 3, wherein the charge storage element comprises at least one capacitor.

11. The return-to-zero transmitter of claim 1, wherein the second signal comprises pulses.

12. The return-to-zero transmitter of claim 1, wherein the one shot circuit comprises:

a delay circuit to provide a third signal indicative of the first signal delayed by a propagation delay; and logic to receive the third and first signals and generate the second signal.

13. The return-to-zero transmitter of claim 12, wherein the logic comprises an exclusive OR gate.

14. The return-to-zero transmitter of claim 12, wherein the delay circuit comprises at least one inverter.

15. The return-to-zero transmitter of claim 1, wherein the return-to-zero pulses are distinguishable and wherein the output circuitry comprises:

a PMOS transistor coupled to generate one of the return-to-zero pulses; and an NMOS transistor coupled to generate another one of the return-to-zero pulses.

16. A method comprising:

receiving a first signal indicative of at least one digital bit;

detecting an edge of the bit in response to the first signal;

in response to the act of detecting, altering an amount of charge in a charge storage element;

during the act of altering, generating a first portion of a return-to-zero pulse; and using the charge storage element to generate a second portion of the return-to-zero pulse.

17. The method of claim 15, wherein the act of altering comprises:

removing charge from the charge storing element.

18. The method of claim 15, wherein the act of altering comprises:

storing charge in the charge storage element.

19. The method of claim 16, wherein the act of detecting comprises:

delaying the first signal to generate a second signal; and comparing the first signal with the second signal.

* * * * *